(12) United States Patent
Chang et al.

(10) Patent No.: US 7,916,768 B2
(45) Date of Patent: Mar. 29, 2011

(54) SMALL DIMENSION HIGH-EFFICIENCY HIGH-SPEED VERTICAL-CAVITY SURFACE-EMITTING LASERS

(75) Inventors: Yu-Chia Chang, Santa Barbara, CA (US); Larry A. Coldren, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 18 days.

(21) Appl. No.: 12/410,388

(22) Filed: Mar. 24, 2009

(65) Prior Publication Data
US 2009/0262765 A1 Oct. 22, 2009

Related U.S. Application Data

(60) Provisional application No. 61/039,048, filed on Mar. 24, 2008.

(51) Int. Cl.
*H01S 5/00* (2006.01)
(52) U.S. Cl. ............. 372/50.124; 372/26; 372/46.013; 372/50.1; 372/50.11
(58) Field of Classification Search .......... 372/26, 372/46.013, 50.124, 50.11
See application file for complete search history.

(56) References Cited

OTHER PUBLICATIONS

Chang et al., High-efficiency, high speed VCSELs with deep oxidation layers in Electronics Letters, Oct. 26, 2006.*

Chang, Y. et al., "High-efficiency, high-speed VCSELs with deep oxidation layers," Electronics Letters, vol. 42, No. 22, Oct. 26, 2006, pp. 1281-1282.
Chang, Y. et al., "High-efficiency, high-speed VCSELs with 35 Gbit/s error-free operation," Electronics Letters, vol. 43, No. 19, Sep. 13, 2007, pp. 1022-1023.
Chang, Y. et al., "High-speed tapered-oxide-apertured 980 nm VCSELs supporting data rates up to 30 Gb/s," Proc. Lasers and Electro-Optics Society Annual Mtg., paper No. WR3, Lake Buena Vista, FL, Oct. 24, 2007, two pages.
Chang, Y. et al., "Small-dimension power-efficient high-speed vertical-cavity surface-emitting lasers," Electronics Letters, vol. 43, No. 7, Mar. 29, 2007, pp. 396-397.
Hegblom, E. et al., "Scattering losses from dielectronic apertures in vertical-cavity lasers," IEEE Journal of Selected Topics in Quantum Electronics, vol. 3, No. 2, Apr. 1997, pp. 379-389.

* cited by examiner

*Primary Examiner* — Dung T Nguyen
(74) *Attorney, Agent, or Firm* — Gates & Cooper LLP

(57) ABSTRACT

A Vertical-Cavity Surface-Emitting Laser (VCSEL) is disclosed, comprising an optical cavity bounded by a top mirror and a bottom mirror, wherein the top mirror has multiple layers of alternating refractive index, of which the bottom three or more layers of the top mirror are deep oxidation layers having an increased oxidation length, a light emitting active region between the top mirror and the bottom mirror, and an aperture with tapered edges between the active region and the top mirror, wherein the aperture has a thickness, a taper length, an oxide aperture length, a taper angle, and an aperture opening diameter designed to reduce an optical mode's diameter without significantly increasing the optical mode's round trip scattering loss.

16 Claims, 8 Drawing Sheets

SMALL DIMENSION HIGH-EFFICIENCY HIGH-SPEED VERTICAL-CAVITY SURFACE-EMITTING LASERS

CROSS REFERENCE TO RELATED APPLICATIONS

This application claims the benefit under 35 U.S.C. Section 119(e) of commonly-assigned U.S. Provisional Patent Application Ser. No. 61/039,048, filed on Mar. 24, 2008, by Yu-Chia Chang and Larry A. Coldren, entitled "SMALL DIMENSION HIGH EFFICIENCY HIGH-SPEED VERTICAL-CAVITY SURFACE-EMITTING LASERS," which application is incorporated by reference herein.

BACKGROUND OF THE INVENTION

1. Field of the Invention

This invention relates to improved performance apertures and mirrors for Vertical-Cavity Surface-Emitting Lasers (VCSELs).

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

VCSELs show promise for use in future optical interconnects because they can achieve higher data rates with less power dissipation. Most of the high-speed VCSELs have larger dimensions, 5-7 μm in diameter, and require higher current to achieve high bandwidth.

Oxide apertures within the VCSEL have been used to minimize power dissipation by constricting current within the lasing modes and guiding laser modes (thereby increasing overlap between carriers and optical modes and reducing sidewall losses) [1,2]. However, in the prior art these apertures have produced undesirable optical scattering due to their imperfect shape [1,2], and a larger mode diameter is needed for low optical loss. The present invention aims to reduce or eliminate this parasitic effect by using properly engineered apertures to enable smaller mode diameters (<5 μm) for increased modulation bandwidth with lower power dissipation. Because of the reduced optical scattering loss at smaller device diameters, the present invention enables both lower parasitic capacitance as well as higher intrinsic modulation bandwidth at lower power dissipation.

SUMMARY OF THE INVENTION

To overcome the limitations in the prior art described above, and to overcome other limitations that will become apparent upon reading and understanding the present specification, the present invention discloses a thicker oxide aperture with a tapered tip designed to reduce the mode volume with minimal added loss. The parasitics are further reduced by using deep oxidation layers. With these novel features, small-dimension high-efficiency high-speed VCSELs can be achieved.

A first embodiment of a VCSEL according to the present invention comprises an optical cavity bounded by a top mirror and a bottom mirror, a light emitting and amplifying active region between the top mirror and the bottom mirror, for generating and amplifying light that is reflected by the top mirror and the bottom mirror to form at least one optical mode, wherein the optical mode is an electromagnetic field intensity pattern of the light measured in a plane perpendicular to a propagation direction of the light; and an aperture with tapered edges, between the active region and the top mirror, having a thickness, a taper length, an aperture length, a taper angle, and an aperture opening diameter designed to reduce the optical mode's diameter without significantly increasing the optical mode's round-trip scattering loss.

The thickness, the taper length, the aperture length, the taper angle, and the aperture opening diameter may be designed such that the aperture opening diameter and the optical mode's diameter are less than 5 micrometers (μm), the optical mode's diameter is reduced until the loss increases above $1 \times 10^{-4}$, the optical mode's diameter is reduced to achieve at least 30 Gigabit per second (Gbit/s) operation of the VCSEL, and/or such that the VCSEL is capable of being modulated with a 3 decibel (dB) modulation bandwidth of at least 15 GigaHertz (GHz).

As the optical mode's diameter is reduced by using a smaller aperture opening diameter and/or a larger taper angle, the optical mode's round-trip scattering loss can still be maintained without a significant increase. The taper angle is typically, but not limited to, between 2 and 10 degrees (°).

A second embodiment of a VCSEL according to the present invention comprises an optical cavity bounded by a top mirror and a bottom mirror, wherein the top mirror has multiple layers of alternating refractive index, of which a bottom three or more layers of the top mirror are deep oxidation layers having an increased oxidation length. The top mirror is typically p-doped to reduce series resistance and the bottom mirror is typically also a multilayered structure of alternating refractive index.

The top mirror may have multiple layers of alternating refractive index, of which a bottom three or more layers of the top mirror are the deep oxidation layers having an increased oxidation length, in order to reduce parasitic capacitance in the VCSEL.

The top mirror may be an AlGaAs/GaAs distributed Bragg reflector (DBR) and the deep oxidation layers may have a higher aluminum concentration than the other multiple layers in the DBR to provide increased longitudinal optical mode confinement in the VCSEL and promote more rapid oxidation to reduce parasitic capacitance of the VCSEL. In one example, there are at least 5 deep oxidation layers. In another example, the deep oxidation length may be such that the deep oxidation layers do not extend over a tapered portion of the oxide aperture.

The first and second embodiments may be combined to improve modulation bandwidth of the VCSEL. In one example, the top mirror and bottom mirror are DBRs and the aperture is an oxide aperture; the thickness of the aperture is in the range between 1/2 to 3/2 wavelength thick measured within a semiconductor comprising the DBR mirror; the taper angle is in the range between 2° to 10°; the aperture opening diameter is in the range between 5 and 15 wavelengths measured within the semiconductor comprising the DBR mirror; and the deep oxidation length is less than or equal to the difference between the taper length and the aperture length.

In another example, the taper angle may be sufficiently large, the aperture opening diameter sufficiently small, and the number of the deep oxidation layers sufficiently high, to reduce the optical mode's diameter and a VCSEL capacitance, while not significantly increasing the loss, such that (1) the VCSEL is capable of operating at 35 Gbit/s or more, (2) the VCSEL has a data-rate/power dissipation ratio of at least 3.5 Gbit/s·mW (Gigabits per second per milliwatt), and/or (3)

the VCSEL has a bandwidth/power dissipation ratio of at least 12.5 GHz/mW at 1 mW operating power.

The present invention further discloses a method of fabricating a VCSEL with increased modulation bandwidth, comprising designing a thickness, a taper length, an aperture length, a taper angle, and an aperture opening diameter for an aperture, to reduce an optical mode's diameter without significantly increasing the optical mode's round-trip scattering loss when the aperture is positioned between a light-emitting active layer and a mirror of the VCSEL. The method may further comprise forming a mirror that has multiple layers of alternating refractive index, of which the bottom three or more layers of the multiple layers are deep oxidation layers having an increased oxidation length.

Thus, the present invention discloses a method of emitting light from a VCSEL, comprising modulating an optical output of the VCSEL with an increased bandwidth of at least 15 GHz to obtain at least 30 Gbit/s operation, wherein the VCSEL lacks a buried tunnel junction and regrowth.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

Figure 1:
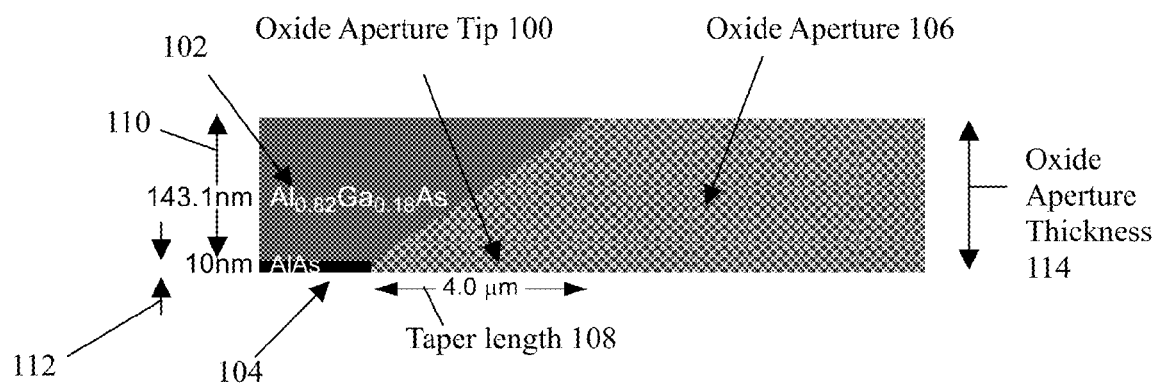
FIG. 1 is a cross-sectional drawing of a tapered aperture tip formed by selective oxidation of mostly AlGaAs, with a thin AlAs layer which oxidizes more rapidly to form the tapered aperture tip.

FIG. 1 shows how a tapered aperture tip 100 may be formed, for example, by selective oxidation of mostly AlGaAs 102, with a thin AlAs layer 104 which oxidizes more rapidly to form the tapered aperture tip 100.

FIG. 1 also shows how the present invention uses a thicker oxide aperture 106 with a shorter taper section 108 than used in the prior art, which has shown that long tapers 108 with taper angles <2° can greatly reduce the optical loss.

In addition, FIG. 1 shows an example where the taper section 108 is 4.0 µm long, the AlGaAs layer 102 is $Al_{0.82}Ga_{0.18}As$ and has a 143.1 nanometer (nm) thickness 110, the AlAs layer 104 has a 10 nm thickness 112, so that the oxide aperture 106 has an oxide aperture thickness 114 of 143.1 nm+10 nm=153.1 nm.

For the present invention, the taper design is optimized for small mode volume as well as low optical losses in the cavity, and therefore shows that taper angles greater than or equal to 2° can still have low optical loss. With this design, the mode volume can be reduced without sacrificing the efficiency. Because the intrinsic (without parasitics) modulation bandwidth is proportional to the reciprocal square-root of the mode volume, reducing the mode volume as much as possible, i.e., until optical losses increase, is desirable and a primary object of the present invention.

Figure 2:
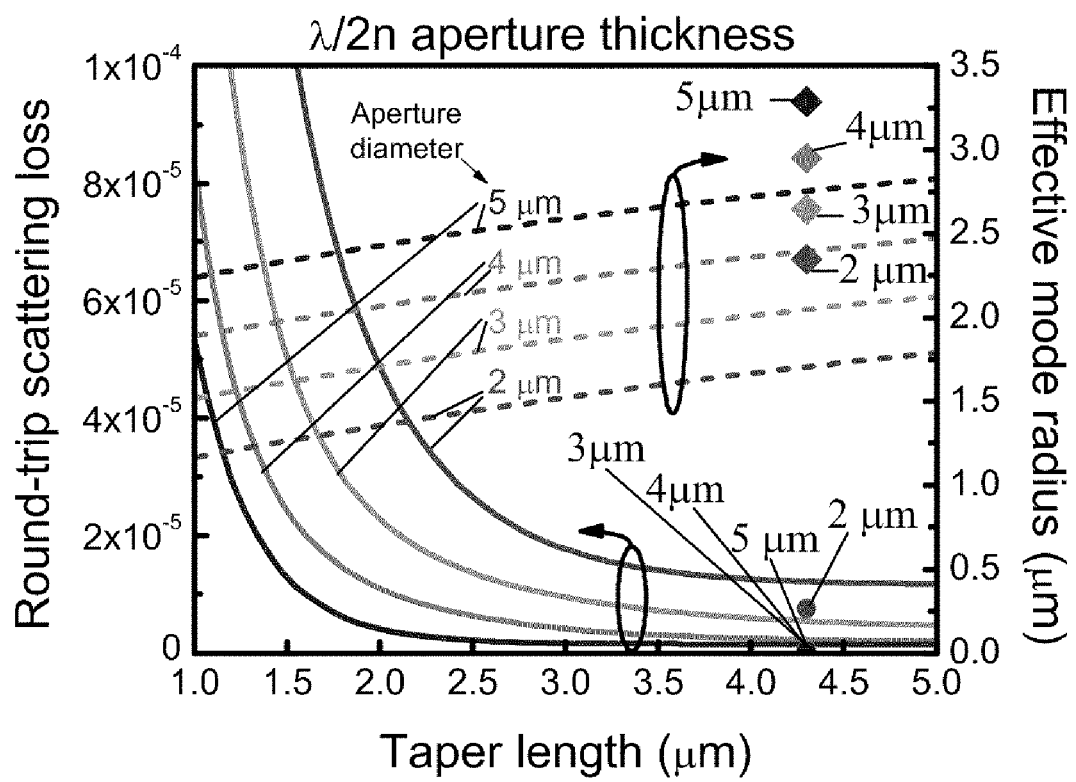
FIG. 2 is a plot of calculated round-trip optical scattering loss (solid curves) and effective mode radius (µm) (dashed curves) versus aperture taper length (µm), for 2 µm, 3 µm, 4 µm, and 5 µm aperture diameters and $\lambda/2n$ thick apertures (where $\lambda$ is the free-space wavelength of light emitted by the VCSEL and n is the refractive index of the semiconductor in the VCSEL), wherein also superimposed are calculated round-trip optical scattering loss (circle scatter points) and effective mode radius (diamond scatter points) for a prior art design with a quarter-wavelength thick aperture and 4.3 µm taper length having a taper angle ~1°, for 2 µm, 3 µm, 4 µm and 5 µm aperture diameters.

FIG. 2 gives a set of design curves taken from Reference [2] that show the trade off between optical loss and mode radius for an example tapered aperture that is a half wavelength thick in the semiconductor medium. Also superimposed are calculated data from a prior art design having an aperture that is a quarter-wavelength thick and has a 4.3 µm taper length and a taper angle ~1°, for 2 µm, 3 µm, 4 µm and 5 µm aperture diameters (diamond and circle scatter points). Although the loss is low, (circle data points), the mode radius is larger than necessary (diamond scatter points). As can be seen, even shorter tapers are possible before the round-trip scattering loss for the mode increases, while the mode radius continues to decrease for the various aperture diameters. Assuming an allowable loss of $10^{-4}$, the present invention observes that a 1 µm taper is permissible for aperture opening diameters of about 4 µm. For the example with the half wavelength thick aperture, this corresponds to a taper angle of about 10°.

Figure 3:
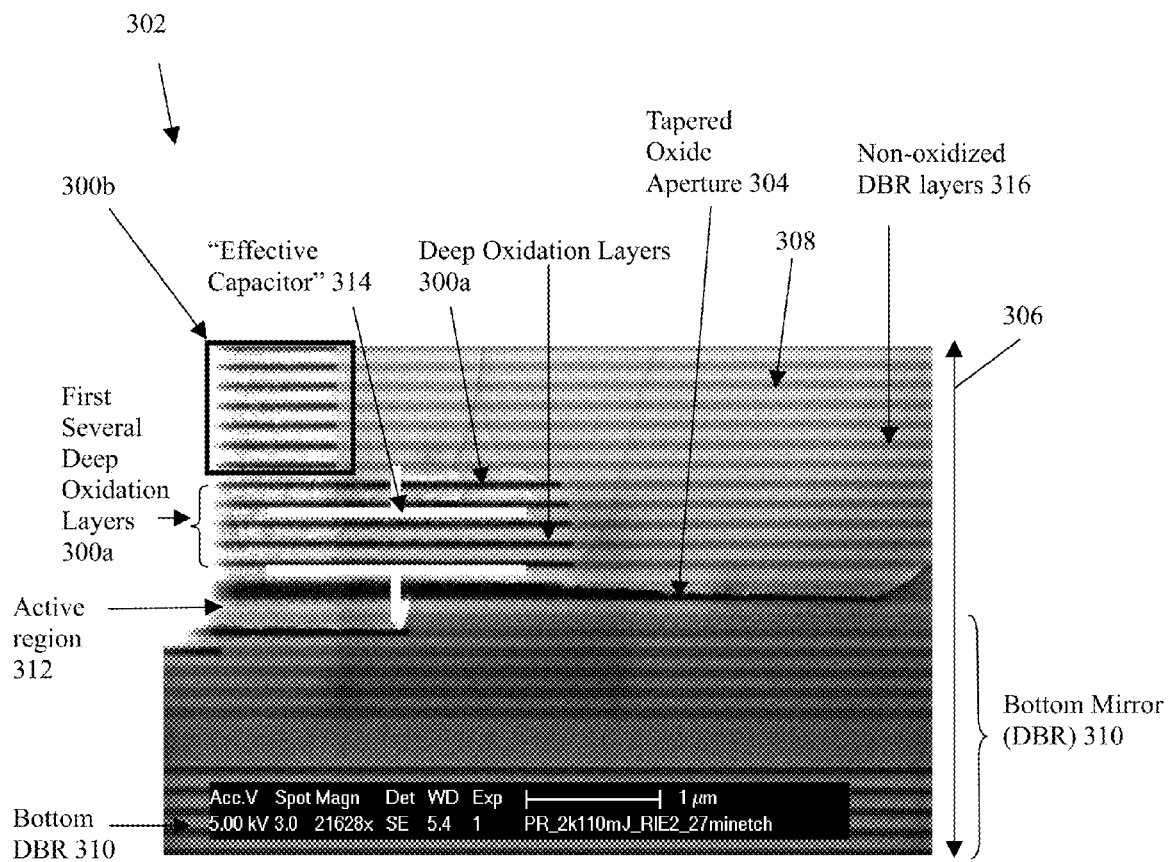
FIG. 3 is a cross sectional scanning electron micrograph (SEM) image of deep oxidation layers in a VCSEL.

One of the obstacles for a VCSEL to achieve high bandwidth is the parasitics. FIG. 3 shows how deep oxidation layers 300a (layers 300b, surrounded by the box in FIG. 3, are not deep oxidation layers, only the layers 300a with a longer oxidation length are the deep oxidation layers) in a VCSEL 302 can be used to reduce the parasitic capacitance. By increasing the aluminum composition of the first several (in the range of 3-10, for example) DBR periods (the layers 300a closest to the oxidized aperture 304), deep oxidation of these layers 300a can occur at the same time the tapered oxide aperture 304 is formed, as shown in FIG. 3. These layers 300a equivalently increase the net dielectric thickness 306, thereby reducing the capacitance associated with the oxide aperture 304 and the intrinsic semiconductor active region 312. In FIG. 3, a white capacitor 314 has been drawn on the SEM image to represent the reduced "effective capacitance" of the deep oxidization layers 300a. Also shown in FIG. 3 are non-oxidized DBR layers 316.

The parasitic capacitance results from the oxide aperture 304 and the intrinsic semiconductor active region 312 below it. Both of them do not have current flowing. The effective capacitance 314 is the capacitance of deep oxidation layer 300a in series with the oxide 304 capacitance in series of the intrinsic semiconductor.

To further improve the high-speed performance, it is desirable to use the shortest taper length that can be used without significantly increasing the optical mode loss at a given diameter. This not only reduces the mode volume but also suppresses higher order modes, making the device operate at a single mode. Single mode operation may also be enabled by the use of etched features on the top mirror 308 surface. Single mode devices have the highest photon density and can achieve the bandwidth with less power dissipation. In addition, since the optical mode is better confined, the deep oxidation layers 300a can also penetrate further inwards towards the center of the aperture, lowering the parasitics.

Figure 4:
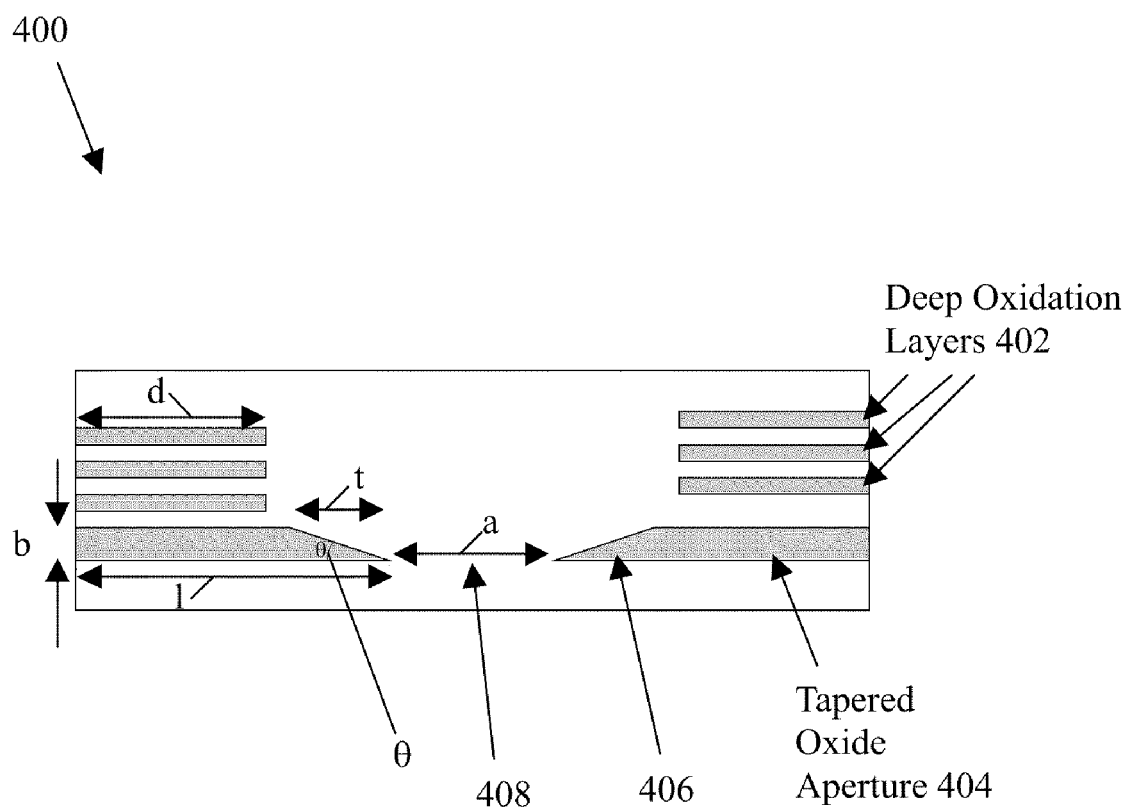
FIG. 4 is a cross-sectional schematic of a portion of a VCSEL showing deep oxidation layers and a tapered oxide aperture.

FIG. 4 is a cross-sectional schematic of a portion of a VCSEL 400 showing deep oxidation layers 402, a tapered oxide aperture 404, a tip portion 406 of the aperture 404, and a center 408 of the oxide aperture 404, where d is the deep oxidation length, b is the thickness of the oxide aperture at the base, t is the taper length, l is the oxide aperture length, θ is the taper angle, and a is the aperture opening diameter.

In one specific embodiment, for the oxide aperture:
1. b is in the range between 1/2 to 3/2 wavelength thick measured within the semiconductor (e.g., AlGaAs) comprising the DBR mirror,
2. θ is in the range between 2° to 10° (with a corresponding t ranging from 5 to 1 μm assuming a 980 nm free-space wavelength, an average refractive index of n=3.0, and a ½ wavelength thick aperture in the semiconductor, e.g., AlGaAs, comprising the DBR mirror),
3. a is in the range between 5 and 15 wavelengths measured within the semiconductor comprising the DBR mirror (for a 980 nm free-space wavelength this corresponds to between 1.4 μm and 4.2 μm), and
4. d is in the range between 0 to l-t, or less than or equal to the difference between t and l.

However, the present invention is not limited to these ranges. FIG. 2 can be used to obtain other designs. The other common aperture 404 is air by etching away the oxide. The aperture 404 is generally a dielectric.

Modulation bandwidth may also be enhanced by p-type doping of the active layer or modulation doping of the barriers between the active quantum wells. All of the above mentioned features can act together to make significant improvements in the outstanding performance already demonstrated.

Furthermore, all of these features can be easily incorporated into the standard oxide-confined VCSEL process, making it suitable for mass production and compatible with existing manufacturing processes.

Figure 5A:
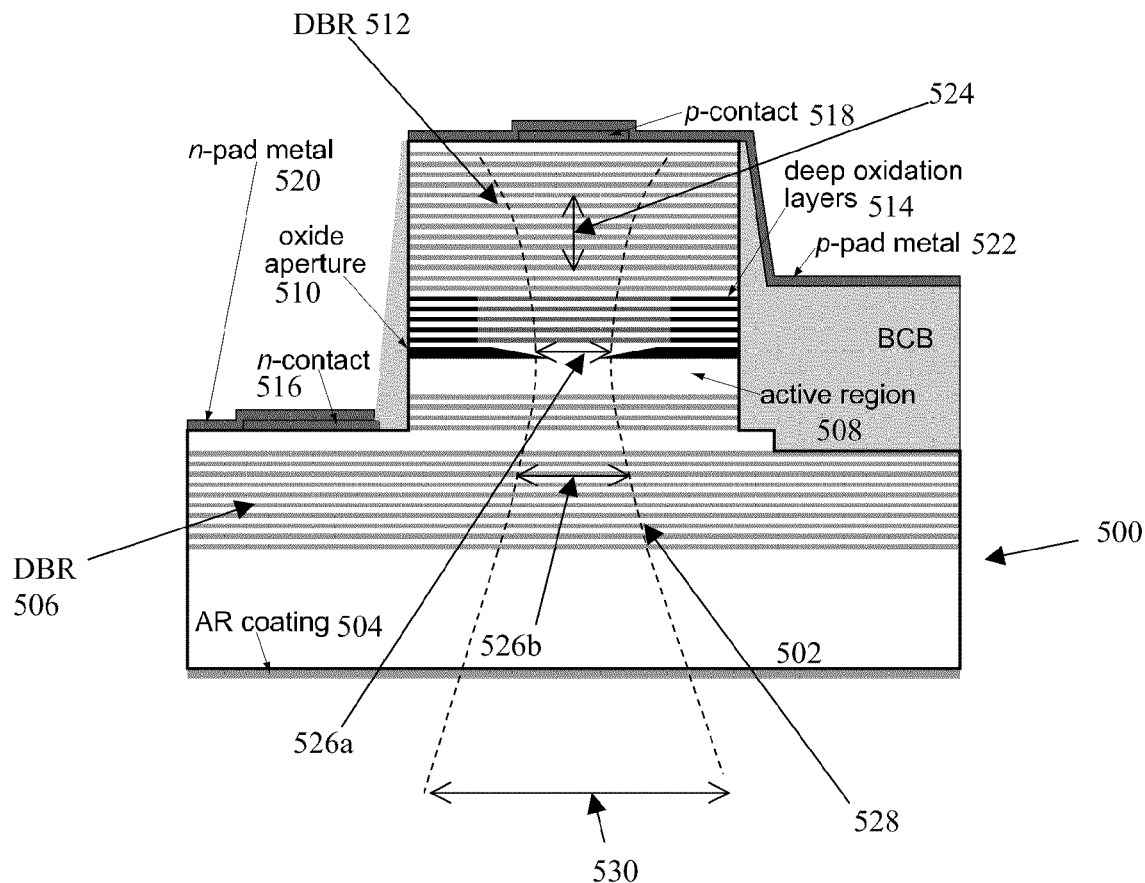
FIG. 5(a) is a schematic cross-section of a VCSEL according to the present invention.

FIG. 5(a) is a cross-sectional schematic of a VCSEL 500 according to the present invention, comprising a semi-insulating GaAs substrate 502, an anti-reflection (AR) coating 504 on the GaAs substrate 502, a bottom DBR mirror 506, an active region 508 on top of the bottom DBR 506, a tapered oxide aperture 510 on the active region 508, a top DBR mirror 512 on the aperture 510, of which the bottom three or more layers 514 of the top DBR 512 (closest to the aperture 510) are deep oxidation layers 514, an n-type contact 516 and a p-type contact 518, and n-pad metal 520 and p-pad metal 522. The optical cavity is bounded by the top, or first mirror 512, and the bottom, or second mirror 506. The light-emitting and amplifying active region 508 between the top mirror 512 and the bottom mirror 506 is for generating and amplifying light that is reflected by the top mirror 512 and the bottom mirror 506 to form at least one optical mode (wherein the optical mode is an electromagnetic field intensity pattern of the light measured in a plane perpendicular to a propagation direction 524 of the light). The diameter 526a, 526b of the optical mode of the light, measured in a plane perpendicular to a propagation direction 524 of the light, is also plotted in FIG. 5(a) as a function of position (along the propagation direction 524) between the top mirror 512 and the bottom mirror 506, and is outlined by dashed lines 528. Thus, the dashed lines 528 show a cross-section of the optical mode within the cavity (between the top mirror 512 and bottom mirror 506) and the laser beam outside the cavity. Also shown is the diameter 530 (the mode diameter keeps increasing due to optical diffraction) of the laser beam outside the cavity.

Figure 5B:
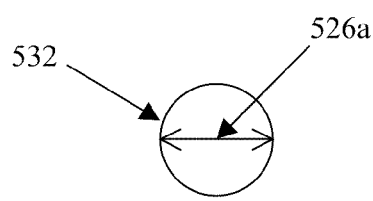
FIG. 5(b) is a schematic top view of an optical mode of FIG. 5(a), showing the optical mode diameter and a Gaussian $TEM_{00}$ shape.

FIG. 5(b) is a schematic top view of an optical mode 532, e.g., a Gaussian Transverse Electromagnetic (TEM) mode such as a $TEM_{00}$ mode, at the location of the optical mode diameter 526a (i.e. at the aperture 510). However, the present invention is not limited to such TEM modes. Typically, the present invention uses the effective mode diameter 526a, i.e., the $1/e^2$ diameter for an equivalent Gaussian mode with the same power and peak amplitude (see [1], page 386).

The aperture 510 with tapered edges, between the active region 508 and the top mirror 512, has a thickness b, a taper length t, an aperture length l, a taper angle θ, and an aperture opening diameter a designed to reduce the optical mode's diameter 526a (the optical mode diameter refers to the diameter 526a at the oxide aperture 510) without significantly increasing the optical mode's 532 round-trip scattering loss (see also FIG. 4). For example, as the optical mode's diameter 526a is reduced by using a smaller aperture opening diameter a and/or a larger taper angle θ, the optical mode's 532 round-trip scattering loss can still be maintained without a significant increase. Thus, the taper angle θ may be sufficiently large, taper length t sufficiently small, and aperture opening a sufficiently small, to reduce the optical mode diameter without significantly increasing loss. For example, the taper angle θ may be between 2° and 10°.

Figure 5C:
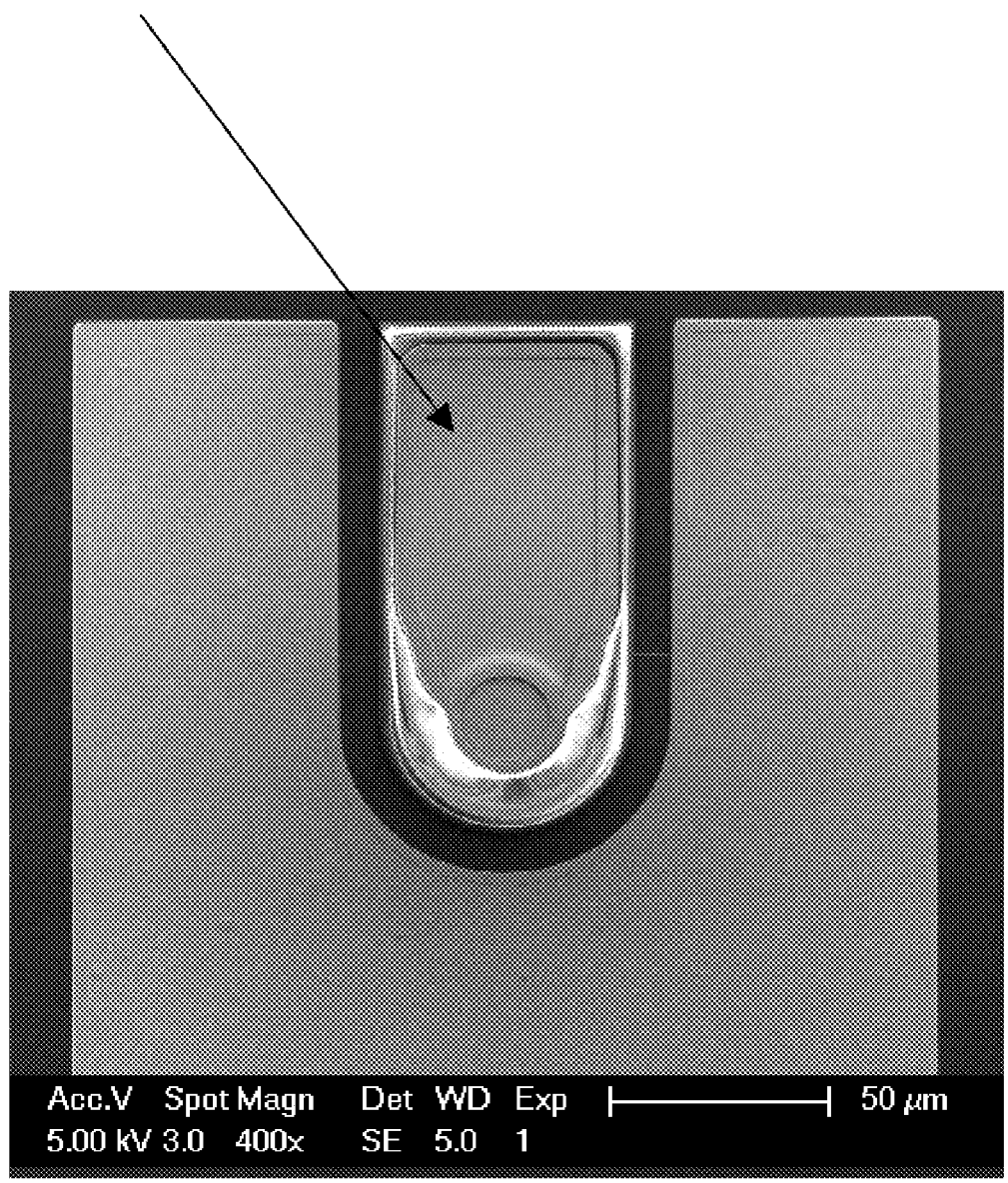
FIG. 5(c) is an SEM image of the top of the VCSEL in FIG. 5(a).

FIG. 5(c) is an SEM image of the top of the VCSEL 500 according to the present invention, showing the p-pad metal 518.

Process Steps

Figure 6:
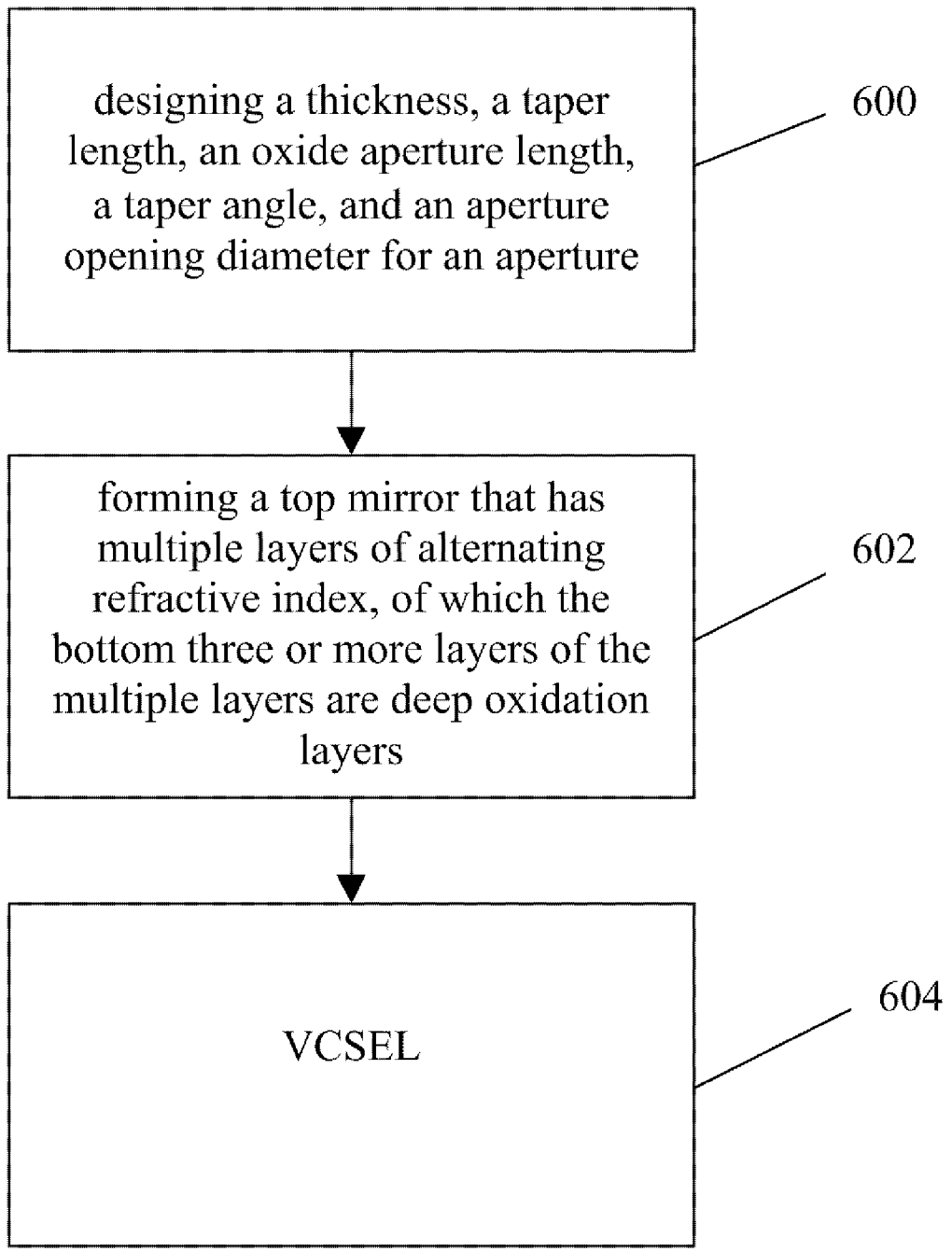
FIG. 6 is a flowchart illustrating a method of the present invention.

FIG. 6 is a flowchart illustrating a method of fabricating a VCSEL with increased modulation bandwidth. The method comprises one or more of the following steps:

Block 600 represents designing/selecting a thickness b, a taper length t, an aperture length l, a taper angle θ, and an aperture opening diameter a for an aperture 404, to reduce (e.g., minimize) an optical mode's diameter 526a without significantly increasing the optical mode's round-trip scattering loss (thereby increasing the VCSEL's 500 intrinsic modulation bandwidth) when the aperture 404 is positioned between a light-emitting active layer/region 508 and a mirror 512 of the VCSEL 500.

Typically, the designing step comprises reducing the aperture opening diameter a and/or increasing the taper angle θ (e.g., between 2° and 10°) to reduce the optical mode's diameter 526a without significantly increasing the optical mode's 532 round-trip scattering loss. The taper shape changes the lateral reflective index profile, which changes the mode profile. Shorter taper length t and large taper angle θ reduces the mode radius but also increases the optical scattering loss.

In one variant, the designing step comprises reducing a mode volume of the VCSEL 500 by reducing the taper length t of the aperture 404, until optical losses in the VCSEL 500 increase. Thus, the taper angle θ is larger, and the taper length t is shorter, as compared to the taper angle θ and the taper length t in a VCSEL having the optical mode diameter 526a which is not reduced.

In another variant, the thickness b, the taper length t, the aperture length l, the taper angle θ, and the aperture opening diameter a are designed to reduce the optical mode diameter 526a until the loss increases above $1 \times 10^{-4}$.

In other variants, the thickness b, taper length t, the aperture length l, the taper angle θ, and the aperture opening diameter a are such that the aperture opening diameter a and the optical mode's diameter 526a are less than 5 μm (or 4 μm, for example).

Figure 7:
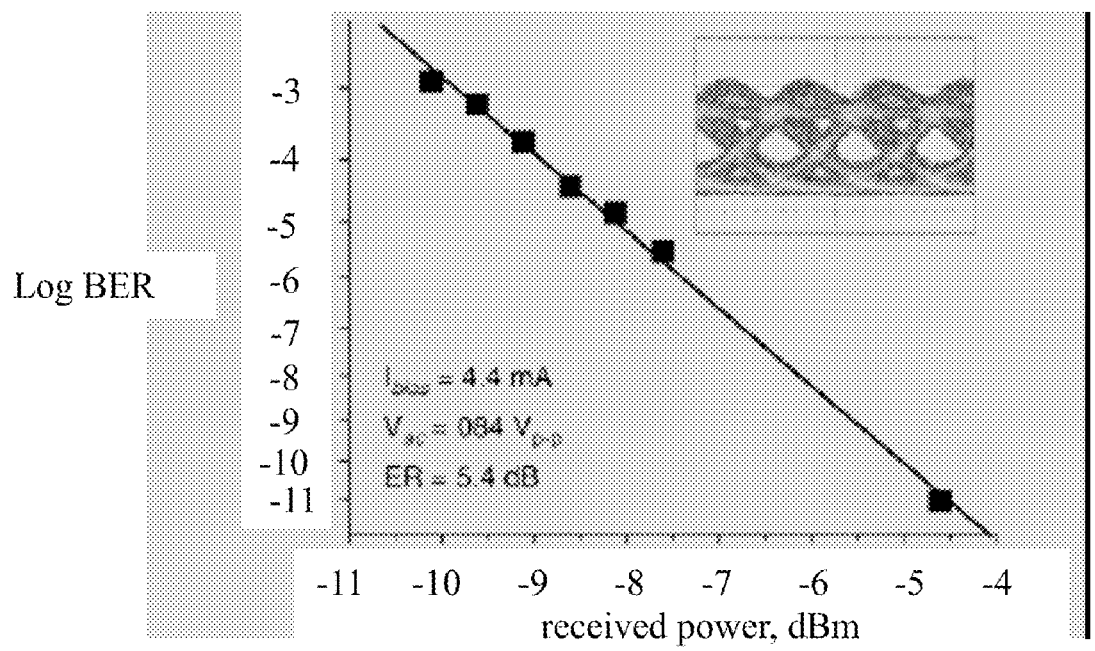
FIG. 7 is a bit error rate (BER) measurement of a VCSEL of the present invention, plotting log BER vs. received power (power in dBm), for a VCSEL bias current $I_{bias}$ of 4.4 milliamps (mA), a voltage swing $V_{ac}$ of 0.84 V peak to peak ($V_{p-p}$), wherein the inset is an optical eye diagram at 35 Gbit/s with an open eye showing an extinction ratio (ER) of 5.4 dB.
Figure 8:
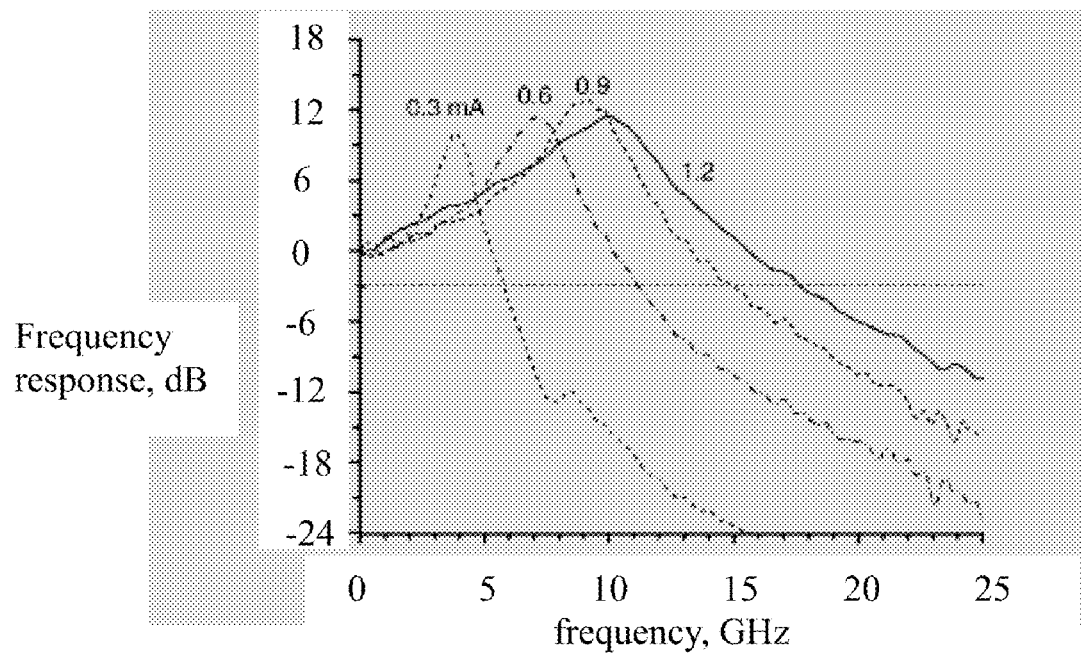
FIG. 8 plots frequency response (dB) as a function of frequency (GHz) for a 3 µm diameter device under 0.3 mA, 0.6 mA, 0.9 mA, and 1.2 mA bias currents and at a temperature of 20 degrees Celsius.

Alternatively, b, t, l, θ, and a may be designed to reduce the optical mode's diameter 526a to achieve at least 30 Gbit/s operation of the VCSEL, or such that the VCSEL is capable of being modulated with a 3 dB modulation bandwidth of at least 15 GHz (see FIGS. 7 and 8). For example, generally speaking, the optical power of the VCSEL can be operated, or switched on and off, at 30 Gbit/s; to be more accurate, in the OFF state the optical power is not zero but low enough so that it can be differentiated from the ON state. When referring to modulation bandwidth, it is small-signal modulation bandwidth, i.e., the modulation amplitude is relatively small compared with the bias point.

Block 602 represents forming a top mirror that has multiple layers 512 of alternating refractive index, of which the bottom three or more layers of the multiple layers 512 are deep oxidation layers 300a, 514 having an oxidation length d, wherein the deep oxidation layers 300a, 514 increase a modulation bandwidth (by reducing parasitic capacitance) of the VCSEL 302 when an optical cavity of the VCSEL 302 is bounded by the top mirror and a bottom mirror 310 and a light emitting and amplifying active region 314 is between the top mirror and the bottom mirror 310.

The top mirror 512 is typically p-doped to reduce series resistance, and the bottom mirror 506 is typically also a multilayered structure of alternating refractive index. The n-contact layer is not necessarily within the bottom mirror 506, the n-contact layer can be either within the bottom DBR 506, e.g., 516, or at the backside of the substrate 502, for example. If the top mirror 512 is an AlGaAs/GaAs DBR, the deep oxidation layers 514, 300a may have a higher aluminum concentration than the other layers 316 in the DBR to provide increased longitudinal optical mode confinement in the VCSEL 500 and promote more rapid oxidation to reduce the capacitance of the VCSEL.

In one variant, there are at least 5 deep oxidation layers 514. In another variant, the deep oxidation length d is such that the deep oxidation layers 402 do not extend over a tapered portion/tip 406 of the oxide aperture 404. However, in yet another variant, the deep oxidation layers 402 can also penetrate further inwards (towards a position above the center 408 of the aperture 404) by increasing the deep oxidation length d, thereby lowering the parasitics.

Block 604 represents the end result of the method, a VCSEL 500. In a first embodiment, the VCSEL 500 comprises means for reducing an optical mode's diameter 526a within the VCSEL 500 without significantly increasing the optical mode's 532 loss, which enables a 3 dB modulation bandwidth of at least 15 GHz, wherein the VCSEL 500 lacks a buried tunnel junction and regrowth. As noted above, the VCSEL 500 of the first embodiment may comprise an optical cavity bounded by the top mirror 512 (e.g. DBR) and the bottom mirror 506 (e.g. DBR), and an aperture 510 with tapered edges having a taper angle θ sufficiently large to reduce or minimize an optical mode diameter 526a of the VCSEL 500 without significantly increasing loss. In a second embodiment, the VCSEL 500 may comprise an optical cavity bounded by the top mirror 512 and the bottom mirror 506, wherein the top mirror 512 has multiple layers of alternating refractive index, of which a bottom three or more layers of the top mirror are deep oxidation layers 300a, 514 having an oxidation length d, in order to reduce parasitic capacitance in the VCSEL 500.

The features of the first and second embodiments may be combined to improve modulation bandwidth of the VCSEL. For example, in a third embodiment represented in Block 604, the taper angle θ is sufficiently large, the taper length t is sufficiently small, the aperture opening diameter a is sufficiently small, and a number of the deep oxidation layers 514 is sufficiently high, to reduce the optical mode's diameter 526a and a VCSEL capacitance, while not significantly increasing the loss, such that the VCSEL 500 is capable of operating at 35 Gbit/s or more, and/or such that the VCSEL 500 has a data-rate/power dissipation ratio of at least 3.5 Gbit/s·mW, and/or such that the VCSEL 500 has a bandwidth/power dissipation ratio of at least 12.5 GHz/mW at 1 mW operating power (as shown in FIGS. 7 and 8). As noted above, when referring to modulation bandwidth, it is small-signal modulation bandwidth, i.e., the modulation amplitude is relatively small compared with the bias point.

The designs of the present invention can extend to other wavelengths emitted by VCSELs as well.

REFERENCES

The following references are incorporated by reference herein.

[1] Y.-C. Chang, C. S. Wang, L. A. Johansson, and L. A. Coldren, "High-efficiency, high-speed VCSELs with deep oxidation layers," *Electron. Lett*, vol. 42, no. 22, pp. 1281-1282, 2006 (Oct. 26, 2006).

[2] E. R. Hegblom, D. I. Babic, B. J. Thibeault, and L. A. Coldren, "Scattering losses from dielectric apertures in vertical cavity lasers," *IEEE J. Sel. Top. Quantum Electron.*, vol. 3, no. 2, 1997.

[3] Y.-C. Chang, C. S. Wang, and L. A. Coldren, "High-speed tapered-oxide-apertured 980 nm VCSELs supporting data rates up to 30 Gb/s," *Proc. Lasers and Electro-Optics Society Annual Mtg.*, paper no. WR3, Lake Buena Vista, Fla. (Oct. 24, 2007).

[4] Y.-C. Chang, C. S. Wang, and L. A. Coldren, "High-efficiency, high-speed VCSELs with 35 Gbit/s error-free operation," *Electron. Lett.*, vol. 43, no. 19, pp. 1022-1023, (Sep. 13, 2007).

[5] Y.-C. Chang, C. S. Wang, and L. A. Coldren, "Small-dimension power-efficient high-speed vertical-cavity surface-emitting lasers," *Electron. Lett*, vol. 43, no. 7, pp. 396-397, (Mar. 29, 2007).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A Vertical-Cavity Surface-Emitting Laser (VCSEL), comprising:
   an optical cavity bounded by a top mirror and a bottom mirror, wherein the top mirror has multiple layers of alternating refractive index, of which a bottom three or more layers of the top mirror are deep oxidation layers having an increased oxidation length, in order to reduce parasitic capacitance in the VCSEL;
   a light emitting and amplifying active region, between the top mirror and the bottom mirror, for generating and amplifying light that is reflected by the top mirror and the bottom mirror to form at least one optical mode in the optical cavity, wherein the optical mode is an electromagnetic field intensity pattern of the light measured in a plane perpendicular to a propagation direction of the light; and
   an aperture with tapered edges, between the active region and the top mirror, having a thickness, a taper length, an aperture length, a taper angle, and an aperture opening diameter designed to reduce the optical mode's diameter without significantly increasing the optical mode's round trip scattering loss.

2. The VCSEL of claim 1, wherein the thickness, the taper length, the aperture length, the taper angle, and the aperture opening diameter are such that the aperture opening diameter and the optical mode's diameter are less than 5 μm.

3. The VCSEL of claim 1, wherein the thickness, the taper length, the aperture length, the taper angle, and the aperture opening diameter are designed to reduce the optical mode's diameter until the loss increases above $1 \times 10^{-4}$.

4. The VCSEL of claim 1, wherein the thickness, the taper length, the aperture length, the taper angle, and the aperture opening diameter are designed to reduce the optical mode's diameter to achieve at least 30 Gigabit per second operation of the VCSEL, or such that the VCSEL is capable of being modulated with a 3 dB modulation bandwidth of at least 15 GHz.

5. The VCSEL of claim 1, wherein, as the optical mode's diameter is reduced by using a smaller aperture opening diameter and a larger taper angle, the optical mode's round trip scattering loss is not significantly increased.

6. The VCSEL of claim 1, wherein the taper angle is larger than a taper angle in a VCSEL having an optical mode diameter that is not reduced.

7. The VCSEL of claim 1, wherein the taper angle is between 2 and 10 degrees.

8. The VCSEL of claim 1, wherein the bottom mirror is a multilayered structure of alternating refractive index.

9. The VCSEL of claim 1, wherein the top mirror is p-doped to reduce series resistance.

10. The VCSEL of claim 1, wherein:
    the top mirror and bottom mirror are distributed feedback mirrors (DBRs) and the aperture is an oxide aperture;
    the thickness of the aperture is in a range between 1/2 to 3/2 wavelengths thick measured within a semiconductor comprising the DBR mirror;
    the taper angle is in a range between 2° to 10°;
    the aperture opening diameter is in a range between 5 and 15 wavelengths measured within the semiconductor comprising the DBR mirror; and
    the deep oxidation length is less than or equal to the difference between the taper length and the aperture length.

11. The VCSEL of claim 1, wherein the top mirror is an AlGaAs/GaAs DBR and the deep oxidation layers have a higher aluminum concentration than the other multiple layers in the DBR to provide increased longitudinal optical mode confinement in the VCSEL and promote more rapid oxidation to reduce a capacitance of the VCSEL.

12. The VCSEL of claim 1, wherein there are at least 5 deep oxidation layers.

13. The VCSEL of claim 1, wherein the deep oxidation length is such that the deep oxidation layers do not extend over a tapered portion of the oxide aperture.

14. The VCSEL of claim 1, wherein:
    the taper angle is sufficiently large,
    the aperture opening diameter is sufficiently small, and
    a number of the deep oxidation layers is sufficiently high,
    to reduce the optical mode's diameter and a VCSEL capacitance such that the VCSEL is capable of operating at 35 Gigabits/second or more.

15. The VCSEL of claim 14, wherein:
    the taper angle is sufficiently large,
    the aperture opening diameter is sufficiently small, and
    the number of the deep oxidation layers is sufficiently high
    to reduce the optical mode's diameter and the VCSEL's capacitance while not significantly increasing the loss, such that the VCSEL has a data-rate/power dissipation ratio of at least 3.5 Gigabits per second per milliwatt.

16. The VCSEL of claim 1, wherein the aperture opening diameter and the optical mode's diameter are sufficiently small, and a number of deep oxidation layers is sufficiently high, such that the VCSEL has a bandwidth/power dissipation ratio of at least 12.5 GHz/mW at 1 mW operating power.

* * * * *